United States Patent [19]

Kittl

[11] 3,929,510

[45] Dec. 30, 1975

[54] SOLAR RADIATION CONVERSION SYSTEM

[75] Inventor: Emil Kittl, Locust, N.J.

[73] Assignee: The United States of America as represented by the Secretary of the Army, Washington, D.C.

[22] Filed: May 22, 1974

[21] Appl. No.: 472,321

[52] U.S. Cl. .................................. 136/206; 136/89

[51] Int. Cl.[2] .......................................... H01L 35/02

[58] Field of Search .............................. 136/206, 89

[56] References Cited

UNITED STATES PATENTS

| | | | |
|---|---|---|---|
| 3,070,643 | 12/1962 | Toulmin, Jr. | 136/206 |
| 3,076,861 | 2/1963 | Samulon et al. | 136/89 |
| 3,751,303 | 8/1973 | Kittl | 136/89 |

*Primary Examiner*—Maynard R. Wilbur
*Assistant Examiner*—Richard E. Berger
*Attorney, Agent, or Firm*—Nathan Edelberg; Robert P. Gibson; Roy E. Gordon

[57] ABSTRACT

A system for converting solar radiation into useful electrical energy is provided. The system includes a silicon cell and solar radiation conversion means integral with or spaced from the silicon cell. The solar radiation conversion means is characterized by a band-emission spectrum that provides a good spectral match with the spectral response of a silicon cell.

6 Claims, 3 Drawing Figures

SOLAR RADIATION CONVERSION SYSTEM

BACKGROUND OF THE INVENTION

This invention relates to a system for converting solar radiation into useful electrical energy.

It is well established in the art that among existing photovoltaic devices, a single crystal silicon photovoltaic cell or silicon cell as it is referred to hereinafter provides the highest conversion efficiency of solar energy radiation into electrical energy. Because of this, the silicon cell has been used in the form of large flat arrays for terrestrial and space power applications with electrical output capabilities from the milliwatt to the kilowatt level. The problem with the silicon cell in this regard is its relatively low conversion efficiency of 10 to 15 percent in direct sunlight. One of the reasons for this low conversion efficiency is that the specific spectral energy of solar radiation does not provide a good spectral match with the response of a silicon cell. In this regard, the band gap energy of 1.1 electron volts in silicon is responsible for two major loss factors in the conversion process.

One of the loss factors involves the fact that in earth environment, the portion of solar radiation with wave length longer than 1.1 micrometer is at least 25 percent of the total solar radiation. This energy is useless to the silicon cell conversion process and generates heat in the cell requiring an increased effort for cooling to keep the cell at its best performance.

The second loss factor involves the fact that the maximum spectral radiance in sunlight occurs at 0.5 micrometer which corresponds to a photon energy of 2.53 electron volts. Only 1.1 electron volts are required to produce the charge carriers, that is, the hole-electron pairs in silicon which contribute to external current flow and power output. The surplus energy of photons in the spectral region for $\lambda < 1.1$ micrometer (E photon energy> 1.1 electron volts) is again converted to heat in the cell.

As a result of the aforementioned losses, the upper limit of spectral efficiency of the silicon cell is 42 percent in terrestrial sunlight. There is an additional source of losses in the silicon cell which is related to the collection mechanism of the generated charge carriers at the p-n junction. That is, the energy distribution of sunlight over a broad spectral band (0.4 micrometer to 3.0 micrometers) causes a distribution of the generated charge carriers versus depth that is unfavorable with respect to the lifetime of carriers and the diffusion length to the junction location. Thus, in a single junction silicon cell, the average collection efficiency does not exceed a value of 0.6 to 0.7. This again provides a large loss factor. There are the additional loss factors in a p-n junction device, like $$\text{voltage factor} = \frac{V \text{ open circuit}}{E_g \text{ energy gap voltage}}$$

and $$V\text{–}I \text{ curve factor} = \frac{V\max \times I\max}{V\text{oc} \times I\text{sc}}$$

which do not depend on the spectral energy distribution of incidental light. With present junction technology they provide a practical upper limit of conversion efficiency of 50 percent of the useful radiation at junction temperatures between 0°–20 °C. There are design trade off factors for the voltage factor and V-I curve factor such that increase in these factors in the order of 10 to 15 percent, which are possible, will have as a result an approximately equal amount in sacrifice of collection efficiency.

It is therefor concluded that no significant gain can be expected from technology improvements on the silicon cell device. The area where the biggest efficiency improvements can come from is the area of spectral utilization of the sun's radiation and its collection efficiency in a Si-cell. This area, at the present state of technology accounts for a loss of approximately 75 percent of the received solar radiation.

SUMMARY OF THE INVENTION

The general object of this invention is to provide a system for converting solar radiation into useful electrical energy. A more specific object of the invention is to provide such a system wherein the solar radiation conversion means is energy conserving and is characterized by a band-emission spectrum that provides a good spectral match with the spectral response of a silicon cell.

Such a system has now been attained by including rare earth compounds in the radiation conversion means. More particularly, the radiation conversion means includes ytterbium oxide and small amounts of at least one other rare earth oxide from the group praseodymium oxide, neodymium oxide, holmium oxide, erbium oxide, and thulium oxide. Ytterbium oxide is used as the major component in the radiation conversion means because the thermal emission spectrum of ytterbium oxide is unique in that it exhibits a single strong emission band at 0.97 micrometer. In this instance, a maximum amount of energy is concentrated in a single band and the ratio of band radiation to total solar radiation is a maximum and comes closest to the ideal case for the silicon cell illuminated with monochromatic light of 1.0 micrometer. Small amounts of other rare earth oxides can be included for energy conservation and to sensitize the ytterbium oxide. This is accomplished by doping the crystal lattice of ytterbium oxide with another rare earth ion having higher lying energy levels that are specifically suited for absorption of the incident solar radiation input.

DESCRIPTION OF THE DRAWING AND THE PREFERRED EMBODIMENT

Figure 1:
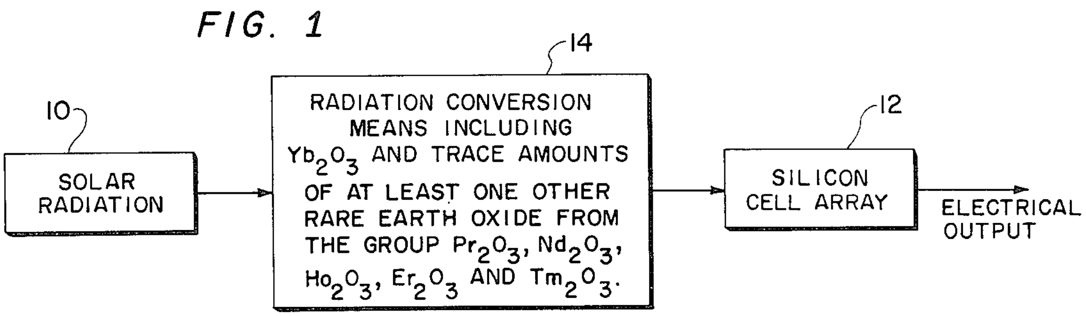
FIG. 1 is a schematic representation of the system for converting solar radiation into useful electrical energy according to the invention.

Referring to FIG. 1 of the drawing, the system includes the source of solar radiation, 10 spaced from a silicon cell array 12. A solar radiation conversion means, 14 including ytterbium oxide and small amounts of at least one other rare earth oxide from the group praseodymium oxide, neodymium oxide, holmium oxide, and thulium oxide is positioned between the source of solar radiation, 10 and the silicon cell array, 12.

Figure 2:
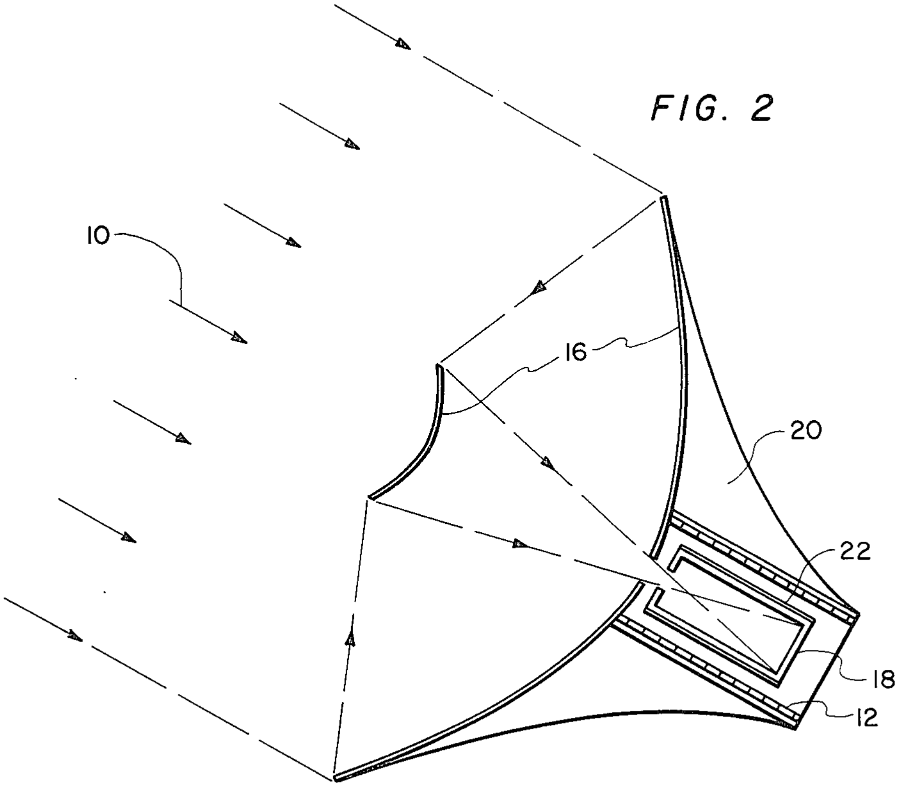
FIG. 2 is a cross-sectional view of an embodiment of the system in which solar energy is first converted into thermal energy which is then converted into useful electrical energy.

Referring to FIG. 2 of the drawing, the radiation conversion means positioned between the source of solar radiation, 10 and the silicon cell array, 12 includes a cassigrain two mirror system, 16 and a cavity receiver, 18 to collect and concentrate solar radiation from the source, 10. This cavity receiver is heated by the absorbed radiation to temperatures between 1500° K and 2000° K. the cylindrical outer surface of the cavity receiver, 18 is comprised of a layer or coating 22 including ytterbium oxide and small amounts in the order of 1 to 5 percent of at least one other rare earth oxide from the group praseodymium oxide, neodymium oxide, holmium oxide, erbium oxide, and thulium oxide. Surrounding the cavity receiver 18 bearing the layer of rare earth oxides is the silicon cell array, 12 which converts the radiation into electrical energy. An integral construction of cooling fins, 20 on the silicon cell array, 12 and cassegrain two mirror system, 16 may serve for cooling the cells by forced or natural air convection.

Figure 3:
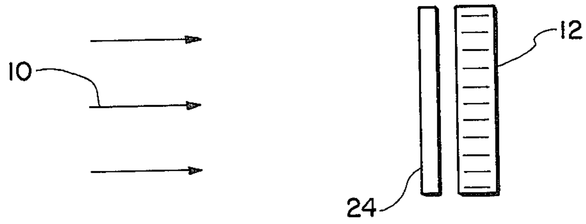
FIG. 3 is a cross-sectional view of an embodiment of the system in which solar energy is converted directly into electrical energy.

Referring to FIG. 3 of the drawing, the radiation conversion means positioned between the source of solar radiation, 10 and the silicon cell array, 12 is a rare earth active filter, 24 operating as a radiation converter. The filter, 24 contains ytterbium oxide and small amounts in the order of 1 to 5 percent of at least one other rare earth oxide from the group praseodymium oxide, neodymium oxide, holmium oxide, erbium oxide, and thulium oxide. The silicon cell array, 12 can be spaced from the rare earth active filter, 24 or integral therewith. If spaced, it is so spaced that a power density in the order of 1 watt/$cm^2$ can be achieved as output from the silicon cell array.

In the embodiment shown in FIG. 2 of the drawing, the cavity receiver, 18 can be a ceramic structure comprised of a mixture of the requisite rare earth oxides, or in the alternative, a coating of the requisite rare earth oxides on a high temperature substrate such as zirconia, silicon carbide, tantalum, molybdenum, etc. The coating is of such a thickness as to prevent transparency of radiation from the hot substrate material. A particularly desireable coating thickness is between 0.2 and 1 millimeter. Such a coating can be conveniently applied to the substrate by plasma spray techniques. Moreover, the cassegrain two mirror system, 16 is so positioned as to provide a concentration of solar energy in the cavity receiver, 18 so that the outer surfaces of the cavity will reach temperatures in the order of 1500°C. to 2,000°C. which will provide sufficient thermal excitation of the band radiation generated in the rare earth oxide coating.

In the embodiment shown in FIG. 3 of the drawing, the active filter, 24 can be conveniently prepared using a solid solution of the mixed rare earth oxides with ytterbium oxide as the major component (90 to 95 weight percent) and the remaining 5 weight percent constituting small amounts of rare earth oxides such as praseodymium oxide, neodymium oxide, holmium oxide, erbium oxide and thulium oxide. Within the scope of the invention, there is also contemplated the use of a host material in which the requisite rare earth oxides are incorporated. Suitable host materials include glassy structures of calcium fluoride, lanthanum oxide, aluminum oxide and ytterbium oxide. The active filter, 24 is of such a thickness as to provide more than 90 percent absorption of sunlight. A particularly desireable active filter thickness is between 0.1 millimeter and 0.5 millimeter for the coatings and between 1 millimeter and 5 millimeters for the glassy host structures.

While there has been described what is at present considered to be the preferred embodiments of this invention, it will be obvious to those skilled in the art that various modifications may be made therein without departing from the invention.

What is claimed is:

1. A system for converting solar radiation into useful electrical energy, said system comprising a silicon cell and solar radiation conversion means, said solar radiation conversion means comprising ytterbium oxide and small amounts of at least one other rare earth oxide selected from the group consisting of praseodymium oxide, neodymium oxide, holmium oxide, erbium oxide, and thulium oxide.

2. A system according to claim 1 wherein the solar radiation conversion means is spaced from the silicon cell.

3. A system according to claim 1 wherein the solar radiation conversion means is integral with the silicon cell.

4. A system according to claim 2 including optical means for collecting and concentrating the sun's radiation.

5. A system according to claim 4 wherein said optical means includes a cassegrain two mirror arrangement and a cavity receiver, said cavity receiver being provided with the solar radiation conversion means.

6. A system according to claim 3 wherein the radiation conversion means is a glassy host material.

* * * * *